United States Patent [19]

Inoue et al.

[11] Patent Number: 5,360,477
[45] Date of Patent: Nov. 1, 1994

[54] METHOD FOR FORMING DIAMOND AND APPARATUS FOR FORMING THE SAME

[75] Inventors: Tohru Inoue; Masaya Kadono; Akiharu Miyanaga, all of Kanagawa, Japan

[73] Assignee: Semiconductor Energy Laboratory Co., Ltd., Kanagawa, Japan

[21] Appl. No.: 24,948

[22] Filed: Mar. 2, 1993

[30] Foreign Application Priority Data

Mar. 4, 1992 [JP] Japan .................................. 4-82701
Sep. 12, 1992 [JP] Japan ................................ 4-269605

[51] Int. Cl.⁵ .............................................. C30B 29/00
[52] U.S. Cl. ........................................ 117/4; 117/5; 117/904; 117/929
[58] Field of Search ............... 156/603, 604, DIG. 68, 156/DIG. 80, DIG. 89; 423/446

[56] References Cited

U.S. PATENT DOCUMENTS

| | | | |
|---|---|---|---|
| 2,947,611 | 8/1960 | Bundy | 156/DIG. 68 |
| 3,423,177 | 1/1969 | Bovenkerk | 156/603 |
| 5,176,788 | 1/1993 | Kabacoff et al. | 156/603 |
| 5,209,916 | 5/1993 | Gruen | 156/DIG. 68 |

FOREIGN PATENT DOCUMENTS 2229793 9/1990 Japan .................... 156/DIG. 68

*Primary Examiner*—Robert Kunemund
*Assistant Examiner*—Felisa Garrett
*Attorney, Agent, or Firm*—Sixbey, Friedman, Leedom & Ferguson

[57] ABSTRACT

A process for fabricating diamond from a starting powder material containing carbon as the principal component, and said process comprising bringing said powder material under high pressure, wherein, said powder material containing carbon as the principal component is a powder material containing $C_{60}$ and/or carbon microtubules as the principal component, and said powder material is brought under high pressure by applying a gradient pressure to the material, while the portion of the powder material to which maximum pressure is applied is irradiated by a laser beam optionally through a diamond window material. An apparatus for fabricating diamond is also described.

16 Claims, 4 Drawing Sheets

METHOD FOR FORMING DIAMOND AND APPARATUS FOR FORMING THE SAME

BACKGROUND OF THE INVENTION

1. Industrial Field of the Invention

The present invention relates to a method for forming diamond by high pressure synthesis employing an anvil press and using $C_{60}$ and/or graphitic carbon microtubules as the starting powder, while heating said starting powder by laser irradiation. The present invention also relates to an apparatus for use in forming diamond by said high pressure synthesis.

2. Prior Art

Synthetic diamonds are now available by two types of processes. One of such process types is vapor phase synthesis as represented by chemical vapor deposition (CVD), and the other is high pressure synthesis which comprises bringing powders of graphite, diamond, etc., under high temperature and high pressure to obtain crystalline diamond therefrom. The high pressure synthesis are further classified into three methods as follows:

1. Impact process; the process comprises bringing the starting powder instantaneously under high pressure by applying impact which is generated by, for example, the explosion of explosives and the collision of a body accelerated to a high speed. In this manner, granular diamond can be obtained by directly converting the starting powder material having a graphite structure into a powder composed of grains having a diamond structure. This process is advantageous in that no press as is required in the two other processes is necessary; however, there is difficulty in controlling the size of the resulting diamond products.

2. Direct conversion process; the process comprises maintaining the starting powder under a high static pressure of from 13 to 16 GPa and a high temperature of from 3,000° to 4,000° C. in a sealed high pressure vessel. By thus realizing stability conditions for diamond, the powder material undergoes direct phase transition from graphite into diamond, through graphite decomposition and structural reorganization into diamond.

3. Flux process; the process is similar to the aforementioned direct process in that a static pressure and high temperature are applied to the starting material. In this process, however, fluxes such as Ni and Fe are utilized to allow the reaction to occur under lower pressure and temperature conditions as compared to those employed in direct conversion process. That is, in the present process, the entire atomic rearrangement which occurs in the conversion process is accelerated by the use of a flux. Specifically, this process comprises charging the flux inside a high pressure vessel in such a manner that it may be enclosed in the starting powder material, i.e., high purity graphite, and then, heating them wholly under a pressure of from 4 to 6 GPa in the temperature range of from about 1,500° to 2,000° C. Thus, the flux turns into a solution and graphite is then dissolved therein to give a saturated solution. Because the pressure inside the high pressure vessel at this point is maintained in the stability range for diamond, the solubility for graphite far exceeds that for diamond. Thus, what happens inside the vessel is diamond precipitation and dissolution of graphite into the flux.

Among the high pressure synthesis processes described above, the second and the third ones using a press are widely used because they enable single crystal diamonds as large as several millimeters in size. This was realized by the advent of apparatuses such as a belt-type apparatus and an anvil apparatus. In fact, such single crystals are unfeasible by vapor phase synthesis.

The aforementioned high pressure synthesis makes the best of a pressure member made from cemented carbide called an anvil. It is attempted at present to realize a further high pressure by using diamond anvils.

The high pressure syntheses described above suffer many problems yet to be solved, however. First comes the poor productivity as a common problem, ascribed to the use of a large scale pressure apparatus which sometimes is as large as several meters in size. There is proposed to increase the productivity by exchanging the high pressure vessels, etc., however, none of the steps can be omitted from the sequence comprising pressing, heating, cooling, and reducing the pressure, nor the steps can be proceeded simultaneously.

As described earlier, it is requisite in the high pressure synthesis to carry out continuously the steps of heating the pressed sample, cooling the sample after completion of the reaction, and taking the sample outside the vessel after reducing the pressure. It is also required that the sample is heated during applying pressure by means different from that for the application of the pressure. However, there was a problem with respect to the means for heating. That is, in a conventional high pressure synthesis, the sample was generally heated by directly applying an electric current thereto. However, the electric resistance of the sample increases with progress in the reaction. Thus, it can be seen that the sample temperature is hardly maintained constant. Accordingly, a process comprising heating by applying an electric current to the sample was unsuitable for synthesizing high quality single crystal diamond, which required maintaining the temperature constant for a relatively long time.

In a flux process employing heating by applying current, there was another problem of precipitating, on one hand, unreacted graphite at the vicinity of the electrodes and on the other, flux at the center between the electrodes. Those precipitates form such a manner as to enclose the diamond portions to give a heterogeneous sample as a result. This phenomenon occurs irrespective of the current applied, i.e., whether a DC or an AC is applied. This is certainly an unavoidable phenomenon, however, it is also true that this lowers the product yield.

As a measure to overcome the aforementioned problems, there is proposed to provide a heater around the sample. This technique, however, requires the sample volume to be considerably reduced as compared to that in heating the sample directly by applying an electric current. Accordingly, this method reversely contributed to the improvement of product yield.

There is also proposed to utilize a laser beam for heating. However, there is no method for using effectively the laser beam for heating the entire sample.

Though there are various problems as enumerated above, the process using a high pressure press still is a unique process which enables synthesis of single crystal diamond or synthetic diamond materials ranging in size from several micrometers to several millimeters. It is therefore important to modify the process so that the characteristics thereof may be fully exhibited.

SUMMARY OF THE INVENTION

The present invention provides a process for fabricating single crystal diamonds well comparable to those conventionally fabricated by a process using high pressure press, but by using an apparatus far more compact than that of a conventional process and at a higher productivity. The present invention also provides an apparatus for fabricating such diamonds.

A method for forming diamond in accordance with the present invention comprises the steps of:

placing a starting material comprising carbon within a vessel capable of pressing said starting material and having a window made of a single crystalline diamond;

pressing said starting material within said vessel; and irradiating at least a portion of said starting material with a laser beam during pressing through said window.

The single crystalline diamond of the window functions as a nucleus of epitaxial growth of a diamond to be formed. An apparatus for forming diamond in accordance with the present invention comprises:

a container for holding a starting material of diamond therein;

pressing means for pressing said starting material placed in said container;

a window provided on a part of said container; and a laser for emitting a laser beam to an inside of said container through said window.

The window and the laser are arranged so that a portion of the starting material is irradiated with said laser beam, where said pressure takes a maximum value at said portion.

DETAILED DESCRIPTION OF THE INVENTION

Figure 1:
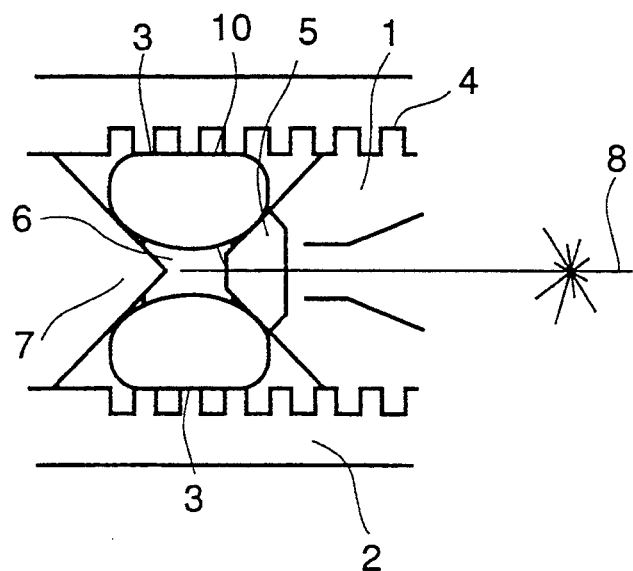
FIG. 1 shows schematically a cylinder-type high pressure vessel.

The present invention relates to a process for synthesizing diamond by applying a pressure having a pressure gradient (distribution), for example, ranging from 2 to 50 GPa, to a starting powder material, while irradiating a laser beam (preferably, an infrared (IR)-emitting laser or a visible light-emitting laser) to the powder material portion to which maximum pressure is applied, said laser beam being passed through a window comprising diamond, wherein, a carbon powder containing $C_{60}$ and/or graphitic carbon microtubules as the principal component(s) is used as the starting powder material. The laser beam has a wavelength capable of crystallizing the starting material. By thus taking such a construction, the present invention facilitates the formation of diamonds. The starting powder material may comprise a fullerene other than $C_{60}$.

The present invention comprises, as mentioned hereinbefore, synthesizing diamond by irradiating laser beam to the portion of a powder material to which maximum pressure is applied, said pressure having a gradient (distribution) and said carbon powder containing $C_{60}$ and/or graphitic carbon microtubules as the principal component(s), wherein, the window through which the laser beam is irradiated to the material is made of a diamond material so that the diamond may be used as a seed crystal for synthesizing diamond.

Furthermore, the process according to the present invention is characterized by that a tapered pressure element is used for applying the gradient pressure (pressure having a distribution) to the starting powder material containing $C_{60}$ and/or graphitic carbon microtubules as the principal component(s). Specifically mentioned as the tapered pressure elements are those shaped into circular truncated cones and truncated pyramids. Circular truncated cones refer to those obtained by cutting a cone along a plane parallel to the bottom plane of the cone, and truncated pyramids refer to those obtained by cutting a pyramid along a plane parallel to the bottom plane of the pyramid. Of course, a pyramid approaches the shape of a circular cone with increasing number of edges.

The process according to the present invention is characterized by that a powder material containing $C_{60}$ and/or graphitic carbon microtubules as the principal component(s) is used in the place of conventional powder materials based on graphite. This is based on a well known fact that the carbon atom constituting a diamond crystal has an $sp^3$ hybrid orbital and that is thereby four-fold coordinated (equilateral pyramid), whereas that constituting graphite has an $sp^2$ hybrid orbital to give a three-fold co-ordination, and that it thereby yields a sheet-like continuous body. It can be seen therefrom that the three-fold coordinated carbon should be completely rearranged to a four-fold coordinated one to synthesize diamond from graphite. This signifies that diamonds are synthesized from graphite only at the expense of a large energy.

On the other hand, $C_{60}$ is a spherical molecule having a bond at an intermediate degree of hybridization between $sp^2$ and $sp^3$ orbitals. Thus, it may undergo structural rearrangement to give a diamond structure using less energy than graphite. There have been reported synthesizing diamonds under high pressure using $C_{60}$ as the starting material, resulting however, in a fine powder of mixed crystals of diamond and graphite, but not in isolated crystals of epitaxially grown diamond.

In addition to $C_{60}$ mentioned hereinbefore, graphitic carbon microtubules may be used in synthesizing diamonds. The graphitic carbon microtubules are carbon crystals having tubular structures, and it is expected that the reactivity would be further increased in using such crystal structures in the synthesis of diamond. Though the physical properties of the graphitic carbon microtubules are yet to be precisely revealed, it is reported that they consist of continuous carbon rings in a spiral arrangement to give a sheet-like morphology. These carbon sheets constitute tubular crystals. The report also shows that the thickness of those tubular crystals vary depending on the synthetic conditions, that sealing occurs on tubular crystals, and that the number of carbon atoms change by the formation of five- or seven-membered rings at such deformed portions. The report also predicts that the binding state of the carbon changes with the synthetic conditions, and that bonds having intermediate hybridization form in abundance.

It can be seen therefrom that the graphitic carbon microtubules have a lower symmetry in the arrangement of carbon rings as compared with $C_{60}$. This signifies that, as compared with $C_{60}$ molecules, the graphitic carbon microtubules abound in crystal structures greatly deviating from a well balanced hybridization. Accordingly, diamond structures can be obtained more easily therefrom with a lower energy. If a stable supply of the material is once established, diamonds can be obtained at high productivity.

An improved productivity can be achieved by the use of graphitic carbon microtubules because, at large, the microtubules can be obtained by mass production. This is the superiority of the microtubules as compared with $C_{60}$. It has been reported recently that graphitic carbon microtubules can be obtained at a far higher yield with respect to that of fullerenes such as $C_{60}$. In the latest report, it is shown that the graphitic carbon microtubules have formed at an yield about three times as large as that of $C_{60}$ by the use of discharge around the atmospheric pressure using graphite electrode in He gas. Conclusively, graphitic carbon microtubules are superior to $C_{60}$ in that they can be more readily rearranged into diamond structure and that they can be more easily supplied as a starting material.

Furthermore, graphitic carbon microtubules are advantageous in that they can be doped with various types of impurities as compared with $C_{60}$. It is not an easy process to prepare a device material or the like using $C_{60}$, because $C_{60}$ molecules are completely spherical. That is, the carbon bonds of $C_{60}$ must be once dissociated, and then the carbon atoms must be substituted by impurities. In contrast to this process, partial dissociation of carbon bonds and replacement of carbon atoms with impurities can be conducted with ease on graphitic carbon microtubules, because of they are less well-balanced in hybridization.

The gradient pressure as referred in the process according to the present invention signifies a pressure field with a distribution in the intensity of pressure. This pressure field can be realized by developing intentionally portions with low and high pressures. It is preferred to establish a pressure gradient as such that the pressure is the highest at the center of the pressure element which applies the pressure, with the pressure gradually decreasing towards the periphery of the element. A pressure element shaped into a circular truncated cone can be mentioned as a preferred one for realizing such a pressure gradient.

In the process according to the present invention, fluxes such as Ni and Fe as mentioned hereinbefore in the description of prior art may be used, but not preferred from the viewpoint of incorporating impurities into the products. Accordingly, the addition of such fluxes should be avoided as much as possible except for such cases in which melting of gaskets for supporting the samples is feared.

Thus, the present invention is based on experimental findings that the high pressure synthesis of diamonds occurs in a chain-reaction like manner by a process which comprises applying a pressure to a powder material being incorporated between two pressure elements by advancing forward the two elements which are a circular cone-shaped diamond pressure element and another circular cone-shaped pressure element facing thereto, provided that a gradient pressure (pressure having a distribution), i.e., a pressure having difference between the center end and the periphery of the pressure element, is applied to the starting powder.

With respect to the shape of the pressure element in particular, an optimal shape for realizing the mechanism of generating the pressure having a distribution was searched, and then some provisional experiments were carried out to confirm them to be effective. As a result, it has been found that the most effective is the use of a diamond anvil (a pressure element in a shape of a circular truncated cone) having a flat plane on the front end in combination with a conical pressure element.

Furthermore, it has been found based on the aforementioned findings that a high pressure synthesis of diamond proceeds in a chain-reaction like manner from $C_{60}$ by the use of a pressure element (a member for applying pressure to the starting material; generally called as anvil) having a shape of a circular truncated cone in combination with a conical pressure element facing thereto, so that a gradient pressure (a pressure having a distribution), i.e., a pressure having difference between the center end and the periphery of the pressure element, may be applied to the powder material, while supplying energy by irradiating a laser beam to the portion to which a maximum pressure is generated. A method for forming diamond in accordance with the present invention comprises the steps of:

placing a starting material comprising carbon in a vessel capable of pressing said starting material where a pressure within said material has a distribution;

pressing said starting material within said vessel; and irradiating at least a portion of said starting material with a laser beam during pressing, wherein the pressure having said distribution takes a maximum value at said portion.

The laser beam is irradiated to said portion of said starting material through a diamond window provided on said vessel.

With respect to the progress of chain reaction on the starting material, the present inventors believe that the so-called fullerene such as $C_{60}$ differs from tubular carbon crystals such as graphitic carbon microtubules as follows. In a spherical or a nearly spherical fullerene, the pressure propagates uniformly into the carbon molecule because of its structural homogeneity. On the other hand, graphitic carbon microtubules have local structures such as in the sealed front end and in tapered portions ascribed to the change in the number of carbon atoms constituting the carbon ring. Those sites serve as specific points from which the structural rearrangement is initiated. The initial reaction propagates to cylindrical graphites having an intermediate hybridization and other neighboring graphitic carbon microtubules to extend structural rearrangement to form a diamond.

The provisional experimentation is described in detail below. It has been reported conventionally a steel dispersion process which comprises dispersing fine chips of carbon steel into the powder material to generate pressure gradient inside the powder, thereby making it feasible to obtain diamonds at a temperature as low as the vicinity of room temperature. The present inventors also attempted to synthesize diamond in the same manner as a provisional experiment. The formation of diamond grains was confirmed as a result, however, they were in fine powder form not larger than 10 $\mu m$ in size. It is also possible to heat the material during processing using laser irradiation or a heater, but at any rate, the incorporation of the impurities is unavoidable.

Furthermore, it can be readily anticipated from the prior art high pressure syntheses that the use of a heater requires a considerable scaling up of the apparatus.

Then, a process using a diamond anvil and a facing pressure element having provided on one surface thereof an acicular protrusion was carried out by way of trial, so that a pressure gradient may be generated on the tip of the protrusion. In this case again, only fine crystal grains similar to that in the steel dispersion process above were available. This result remained essentially the same even when heating using a laser beam was applied.

In contrast with the processes above, a diamond having the largest diameter was obtained by applying a gradient pressure (pressure having a distribution) using a diamond anvil being tapered along the center to give a shape of circular truncated cone and its surface being mirror finished to a powder material containing $C_{60}$ as the principal component, while irradiating a laser beam to the center of the diamond anvil at which the maximum pressure was generated.

It is not yet clarified on the role of gradient pressure (pressure having a distribution) applied to the powder material during the process, however, the present inventors assume that the pressure functions in a manner similar to the function of fluxes such as Ni and Fe in the flux process. More specifically, the present inventors presume that the components travel inside the material in accordance with the solubility which depends on the pressure conditions; i.e., the component having heated to develop a diamond structure move spontaneously to the high pressure portions while those still maintaining the graphite structure move towards the low pressure portion. In this manner, the central portions becomes enriched with diamond phase.

Accordingly, the present invention is characterized by that a proper pressure gradient is developed inside the material so that the diamond phases may grow larger by segregation in the same manner as in flux process; that a diamond window material comprising a diamond functioning as a nucleus of epitaxial growth of a diamond to be formed is located at the portion to which maximum pressure is applied; and that a laser beam is irradiated through the diamond window material above to the portion to which maximum pressure is applied, to thereby arrange the conditions for rapid epitaxial growth of diamond grains. Furthermore, a powder material containing $C_{60}$ as the principal component is supplied under the aforementioned conditions suited for epitaxial growth of diamond, so that the epitaxial growth of diamond may occur using the diamond window material as the seed crystal and consuming lower energy.

Still more, graphitic carbon microtubules suitable for forming a diamond structure at a low energy and superior to $C_{60}$ with respect to supply efficiency is used under the aforementioned conditions suited for epitaxial growth of diamond, so that the epitaxial growth of large diamond crystals may take place using the diamond window material as the seed crystal.

Furthermore, in the construction according to the present invention, the use of a combination (or mixture) of $C_{60}$ and a graphitic carbon microtubule yields a similar favorable result. In such a case, it is believed, considering the degree of hybridization of the carbon atoms, that the structural rearrangement is initiated from graphitic carbon microtubules and is proceeded in such a manner that the diamond structure may encapsulate $C_{60}$. Thus, by controlling arbitrarily the mixing ratio of $C_{60}$ and graphitic carbon microtubules, it is possible to obtain diamonds of desired grain diameter and at a desired reaction rate.

The present invention is illustrated in greater detail referring to non-limiting examples below. It should be understood, however, that the present invention is not to be construed as being limited thereto.

EXAMPLE 1

An apparatus for fabricating diamond according to an embodiment of the present invention is described below.

The present example relates to an apparatus which enables fabrication of large grains of diamonds under a pressure and temperature both lower than those of the conventional high pressure synthesis. The apparatus is intended for a process which comprises using a powder containing $C_{60}$ and/or graphitic carbon microtubules as the principal component(s). In the process, a gradient pressure (pressure having a distribution) is applied to the powder while a laser beam is irradiated to the portion to which maximum pressure is applied.

Referring to FIG. 1, an apparatus for fabricating diamond according to an embodiment of the present invention is described. The cylindrical compression apparatus (referred to as "high pressure vessel," hereinafter) shown in FIG. 1 is equipped with a pressure element 1 having a shape of circular truncated cone for generating pressure, and to the front end thereof is provided a diamond window material 5. The entire pressure element for generating pressure is referred to hereinafter as "upper pressure element 1." The upper pressure element 1 is provided movable along the spiral groove 4 provided inside a cylinder 2, so that a starting powder material ($C_{60}$, in this case) 6 being supported by a gasket 3 may be compressed between the upper pressure element 1 and another pressure element (referred to hereinafter as "lower pressure element") 7. Here, a pressure element having a shape of circular truncated cone obtained by cutting off the apex of a cone is used as the upper pressure element 1 so that a gradient pressure as mentioned earlier may be generated. By employing an upper element having this specific shape, a gradient pressure (pressure having a distribution) can be applied to the powder material and, at the same time, a maximum pressure can be generated at the top 10 of the upper pressure element 1. As a matter of course, both the upper pressure element 1 and the lower pressure element 7 may have a shape of circular truncated cone.

The gasket 3 is provided as a support for the powder material. It also functions as a pressure medium to apply the pressure to the powder from the surroundings. The gasket 3 may be made from iron (Fe), SUS stainless steel, and nickel (Ni). In this example, an iron gasket was used.

Figure 2:
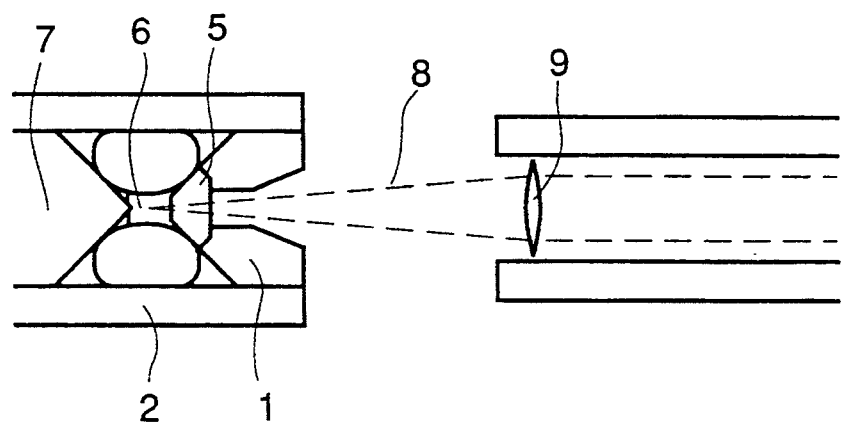
FIG. 2 shows schematically the manner of laser irradiation.

The starting powder material for synthesizing diamond therefrom was compressed by screwing the upper pressure element 1 along the spiral 4. At this point, the lower pressure element 7 was fixed. The pressure was elevated until the pressure on the powder 6 reached a range of from 2 to 3 GPa. Then, a laser beam in the infrared wavelength region having emitted from carbon dioxide gas laser (referred to hereinafter as "$CO_2$ laser") was irradiated to the starting powder material. The laser output variable in accordance to the temperature which is intended to attain by heating. In FIG. 2 is shown schematically the manner of irradiating a laser beam to the powder material. The laser beam 8 having emitted from the $CO_2$ laser is focused by the lens 9, so that it may be irradiated right to the powder material 6 through a diamond window material 5. The pressure was detected by measuring the rotational torque of the upper pressure element 1 which moves inside the cylinder 2 by rotating along the spiral 4.

At this point, the powder portion under maximum pressure (marked with 10 in FIG. 1), to which the laser beam is irradiated for heating, undergoes melting so that epitaxial growth may occur using the diamond window material 5 (the material used for the window through which the laser beam is irradiated) as the seed crystal. As a result, the carbon atoms rearrange themselves from $C_{60}$ to diamond so that a direct conversion from $C_{60}$ to diamond may take place. The epitaxial growth of diamond can be effectively carried out only when all of the diamond window at the portion under maximum pressure, the laser beam irradiated to the portion of maximum pressure, and the use of $C_{60}$ as the starting powder material are realized at a time. At this point, only graphite dissipates into a portion slightly lower in pressure from a portion consisting of a combination of graphite and $C_{60}$ converting to diamond, so that the growth of a high purity diamond only may proceed.

A part of gasket 3 also melts with elevating temperature. In a high pressure diamond synthesis as in this case, the graphite which forms inevitably is generally taken up by the melting gasket 3. However, as mentioned hereinbefore, the central epitaxial growth is accelerated in this case that the influence of the melting of gasket 3 on diamond is little.

In the apparatus for fabricating diamond according to the present example, the cylinder can be wholly exchanged or moved right at the back of the laser beam radiation port. This facilitates repetition of the process steps as described above, and hence enables continuous high pressure synthesis of diamonds.

EXAMPLE 2

An application of the apparatus for fabricating diamond as described in Example 1 to a process of diamond fabrication is illustrated below.

The use of the construction according to an embodiment of the present invention lowers the pressure and temperature required for the synthesis as compared to the conventional high pressure synthesis using graphite powder. It therefore results in a process using a more compact apparatus. In the present example, a one-dimensional compression apparatus, which applies pressure one-dimensionally and which is shown in FIG. 1, is used.

Figure 3:
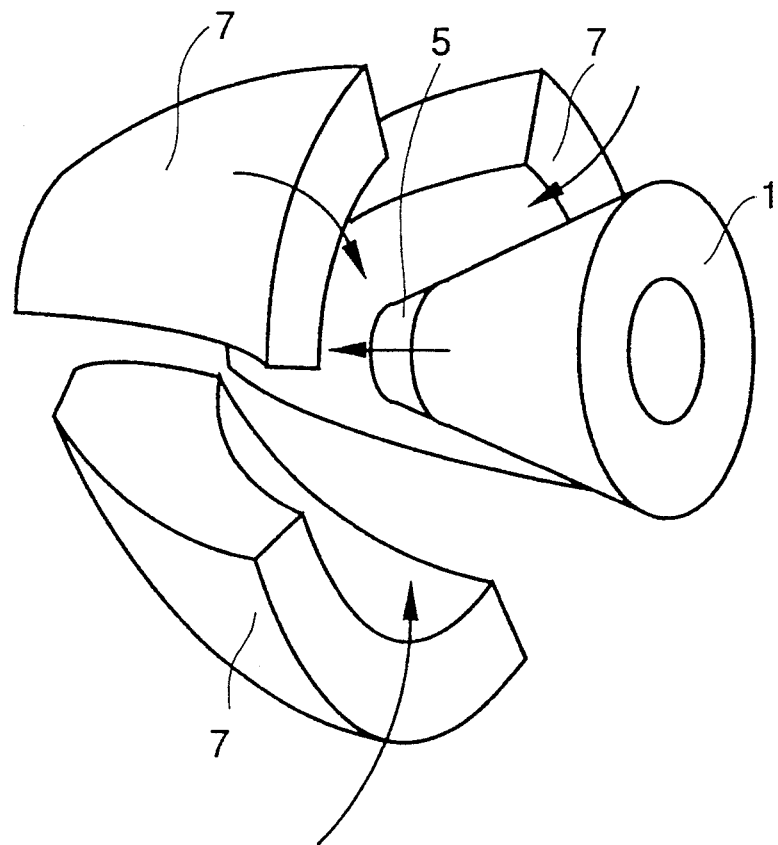
FIG. 3 shows schematically a high pressure vessel comprising a separable lower pressure element.

The apparatus for use in the present Example may have, as shown in FIG. 3, a structure which comprises a lower pressure element separable into a plurality of segments, provided that a pressure gradient can be generated as such that a maximum pressure is developed at the front end of the upper pressure element, i.e., at the portion to which laser beam is introduced. The apparatus shown in FIG. 3 is essentially the same with that shown in FIG. 1, and the parts with corresponding numerals represent the same as in FIG. 1. That is, the apparatus comprises an upper pressure element 1, a lower pressure element 7 which is separable into plurality of segments, and a diamond window material 5. Furthermore, the shape of the pressure elements is not only limited to a complete circular truncated cone or a truncated pyramid, but any type of shapes may be used as long as a gradient pressure (pressure having a distribution) can be applied to the starting powder material and as a laser beam can be irradiated through a diamond window material to the portion at which maximum pressure is applied.

In the present Example, a $CO_2$ laser emitting a beam 10.6 μm in wavelength was used as the laser source. A 2a-type single crystal diamond plate which yields a transmittance of 70% or more for a light 10.6 μm in wavelength was used as the diamond window material 5 which functions also as a pressure element and as a window for introducing the laser beam. The diamond window material 5 was obtained by tapering the edge planes to a diameter of 10 mm and 5 mm, and a thickness of about 7 mm.

It is preferred, of course, that the wavelength of the light transmittable by the diamond which constitutes the window material 5 for introducing the laser beam is well matched with the wavelength of the laser. If a laser source is assured of stable irradiation, the type of the diamond window material 5 and the method of applying pressure may have other selections. There is no particular limitation on the type of the laser source and the type of diamond used in the present invention.

A commercially available powder containing 98% by weight of $C_{60}$ and balance $C_{70}$ was used as the starting powder material 6. The process consumes from about 5 to 7 g of this powder at one time. The powder was charged into a hole 4.5 mm in diameter and 25 mm in length, which was defined by the lower pressure element and the iron gasket 3. It is not preferred from the viewpoint of effectively utilizing the pressure generated by the pressure element that the diameter of the hole for charging therein powder exceeds that of the diamond window material 5 through which the laser beam is introduced. With respect to the depth of the hole, on the other hand, may be adjusted by taking into account the amount and quality of the powder, and the capacity of the gasket material. Accordingly, the diameter of the hole may be adjusted depending on the dimension of the diamond window material 5 which is used in the process.

Figure 4:
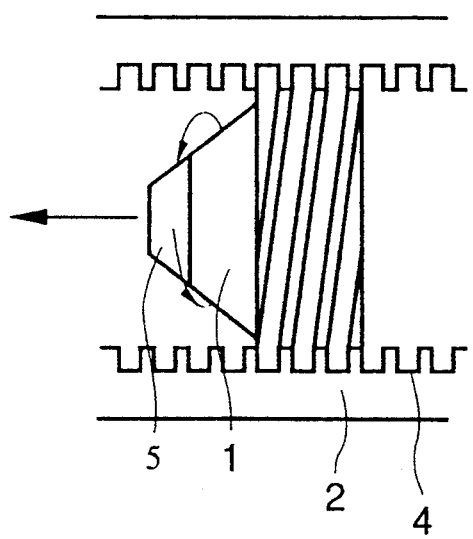
FIG. 4 shows schematically the mechanism of pressing.

The starting powder material containing $C_{60}$ as the principal component was charged in the hole confined by the lower pressure element 7 and the gasket 3 (indicated with numeral 6 in FIG. 1), and was pressed by moving the upper pressure element 1 equipped with the diamond window material 5 towards the lower pressure element 7 by rotating the element 1 along the inner wall of the cylinder. The manner of moving the pressure element is shown in FIG. 4. The pressure which is generated on the powder material between the upper and lower pressure elements was measured beforehand in a provisional experiment, and the position and the distance of displacement for the desired pressure were determined based on the previously measured results. In the present example, the pressure applied between the upper and lower pressure elements was set to 3 GPa, a pressure lower than that used in a flux process.

The internal pressure in the starting powder material is not uniform due to the gradient pressure (pressure having a distribution) applied thereto. In particular, the pressure applied between the upper and lower pressure elements on the straight line 8 which represents a laser beam in FIG. 1, takes the maximum value, i.e., a value far higher than any one applied to other portions of the powder material. The aforementioned pressure between the upper and lower pressure elements as referred herein signifies the pressure at this portion (indicated with numeral 10 in FIG. 1) to which a maximum pressure is applied.

After charging the $C_{60}$ powder inside the cylinder 2 under a predetermined pressure as shown in FIG. 1, the vessel to which the powder material had been charged under high pressure was mounted on the outlet of a $CO_2$ laser. The position of mounting the cylinder 2 was as shown in FIG. 2. The laser beam focus can be controlled by the lens 9 provided at the beam outlet of the $CO_2$ laser. The diamond window material exposed to outside from the upper pressure element was 4 mm in diameter.

The laser beam should be well adjusted so that it may not be brought into contact with the upper pressure element, and that it may be focused at the $C_{60}$ powder which is placed deeper than the diamond window material. When the laser beam is properly focused to the $C_{60}$ powder, melting occurs on the $C_{60}$ powder to initiate epitaxial crystal growth of diamond by structural rearrangement, using the diamond window material as the growth nuclei. When the laser is improperly focused to the diamond side, however, the diamond window undergoes decomposition and suffers loss of strength. Then, the window breaks, and hence, the conditions for diamond growth are lost. A number of provisional experiments must be conducted beforehand for appropriately adjusting the focus. Then, in the experiment, it has been confirmed as a result that the diamond window material is mechanically strong enough as to endure sufficiently the heat from laser irradiation and that $C_{60}$ effectively undergoes dissociation and structural rearrangement by thus focusing the laser to the side of $C_{60}$ powder.

The powder material was maintained under the high pressure and high temperature condition for 2 to 3 hours. After waiting for a sufficiently long time for the reaction to proceed, the laser output was lowered. The maximum reaction temperature was assumably about 2,000° C., as estimated using an optical thermometer. However, an accurate measurement of the temperature is difficult, because of the adjustment of the distance of the focus and of the reliability of the optical thermometer.

Then, the high pressure vessel was dismounted from the $CO_2$ laser beam outlet. The upper pressure element was released, and the sample was taken out from the high pressure vessel after reducing the pressure.

EXAMPLE 3

An example of synthesizing diamond using a powder of graphitic carbon microtubules as the starting material is illustrated below.

In the present example, a $CO_2$ laser emitting a light 10.6 μm in wavelength was used as the laser beam source, and a 2a-type single crystal diamond plate was used as the diamond window material 5, as in Examples 1 and 2.

About 5 to 7 g of a carbon powder containing about 25% of graphitic carbon microtubules was used as the starting powder material 6. The powder was obtained by the present inventors by discharge synthesis using graphite electrode in He gas atmosphere under atmospheric pressure. The powder was charged in a hole defined by the lower pressure element and the iron gasket 3, and was compressed by moving the upper pressure element 1 towards the lower pressure element by rotating the upper pressure element along the inner wall of the cylinder 2. The pressure in this process again was maintained at 3 GPa. The pressure applied between the pressure elements refer to the pressure measured at the portion to which the maximum pressure is applied (indicated with numeral 10 in FIG. 1).

After charging the powder containing graphitic carbon microtubules inside the cylinder 2 under a predetermined pressure as shown in FIG. 1, this vessel having charged therein the powder under high pressure was mounted on the outlet of a $CO_2$ laser. The laser beam should be well adjusted so that it may be focused to the powder which is placed deeper than the diamond window material.

When the laser beam is properly focused to the powder, melting occurs to the powder to initiate epitaxial crystal growth of diamond by structural rearrangement, using the diamond window material as the growth nuclei. The powder material was maintained under the high pressure and high temperature condition for 2 to 3 hours. After waiting for a sufficiently long time for the reaction to proceed, the laser output was lowered. Then, the high pressure vessel was dismounted from the $CO_2$ laser beam outlet. The upper pressure element was released, and the sample was taken out from the high pressure vessel after reducing the pressure.

EXAMPLE 4

An example of synthesizing semiconductor diamond using as the starting material, a powder of graphitic carbon microtubules having doped therein substituent impurities is illustrated below.

In the construction according to the present invention, the use of graphitic carbon microtubules as the starting powder material enables fabrication of semiconductor diamond in which impurities are more easily incorporated as compared with the conventional high pressure synthesis using graphite powder or $C_{60}$ powder.

About 5 to 7 g of a carbon powder containing about 25% of graphitic carbon microtubules was used as the starting powder material 6 as in Example 2. This powder was partly substituted by nitrogen by supplying nitrogen gas flow at an amount corresponding to from about 0.1 to 25% by atomic, more preferably, from 1 to 5% by atomic, of nitrogen during the discharge synthesis in He under atmospheric pressure. This powder was intended for fabricating n-type diamond semiconductor. If a p-type semiconductor were to be obtained, a gas of a boron compound may be used in the place of nitrogen in the foregoing steps. Furthermore, a gas of, for example, a phosphorus compound may be used as well for fabricating an n-type semiconductor. At this stage, however, no consideration is given to the state of carbon-nitrogen inside the graphitic carbon microtubules.

The powder was charged in a hole defined by the lower pressure element 7 and the iron gasket 3, and was compressed by moving the upper pressure element 1 towards the lower pressure element by rotating the upper pressure element 1 along the inner wall of the cylinder Z in the same manner in the foregoing examples. The pressure in this process was maintained at 4.2 GPa, a value slightly higher than those employed in Examples 1 to 3.

Then, laser beam was irradiated to the vessel to which the powder is charged under a high pressure, in the same manner as in the foregoing Examples 1 to 3. That is, the vessel was mounted on the outlet of a $CO_2$ laser. The laser beam was adjusted as such that it may be focused to the powder which is placed deeper than the diamond window material. The powder material was maintained under the high pressure and high temperature condition for 2 to 3 hours. After waiting for a sufficiently long time for the reaction to proceed, the laser output was lowered. Then, the high pressure vessel was dismounted from the $CO_2$ laser beam outlet. The upper pressure element was released, and the sample was taken out from the high pressure vessel after reducing the pressure.

EXAMPLE 5

It is anticipated that the quality of diamond is influenced by changing the focus distance of the laser beam. This is because the distance between the laser beam focus and the diamond window material 5 which serves as the seed crystal changes as a result. Accordingly, the effect of changing the focus distance on the diamond was investigated by focusing the laser beam at a distance of about 12 mm from the diamond window material. The other conditions were maintained the same as those employed in Example 1. The sample was maintained for 2 to 3 hours while heating to allow the reaction to take place.

Evaluation of the Samples obtained in the Examples

The samples obtained in Examples 1 to 5 were compared and evaluated as follows.

The evaluation was made on appearance (observation with naked eye on the size and color of the sample), and the product quality as read from Raman spectroscopic analysis.

A favorable single crystal diamond from 0.5 to 1.5 mm in diameter was obtained for Example 2. It was observed to accompany crust-like precipitates as impurities at the boundary between the gasket 3, the lower pressure element 7, and the sample. A precipitate containing about 20% of a precipitate based on amorphous carbon was obtained for Example 5. The result for Example 2 is believed ascribable to the deviation of the laser beam focus, thereby not using effectively the diamond window as the seed crystal. Thus it was confirmed that the setting of a laser beam focus plays an important role in determining the quality of the diamond.

Figure 5:
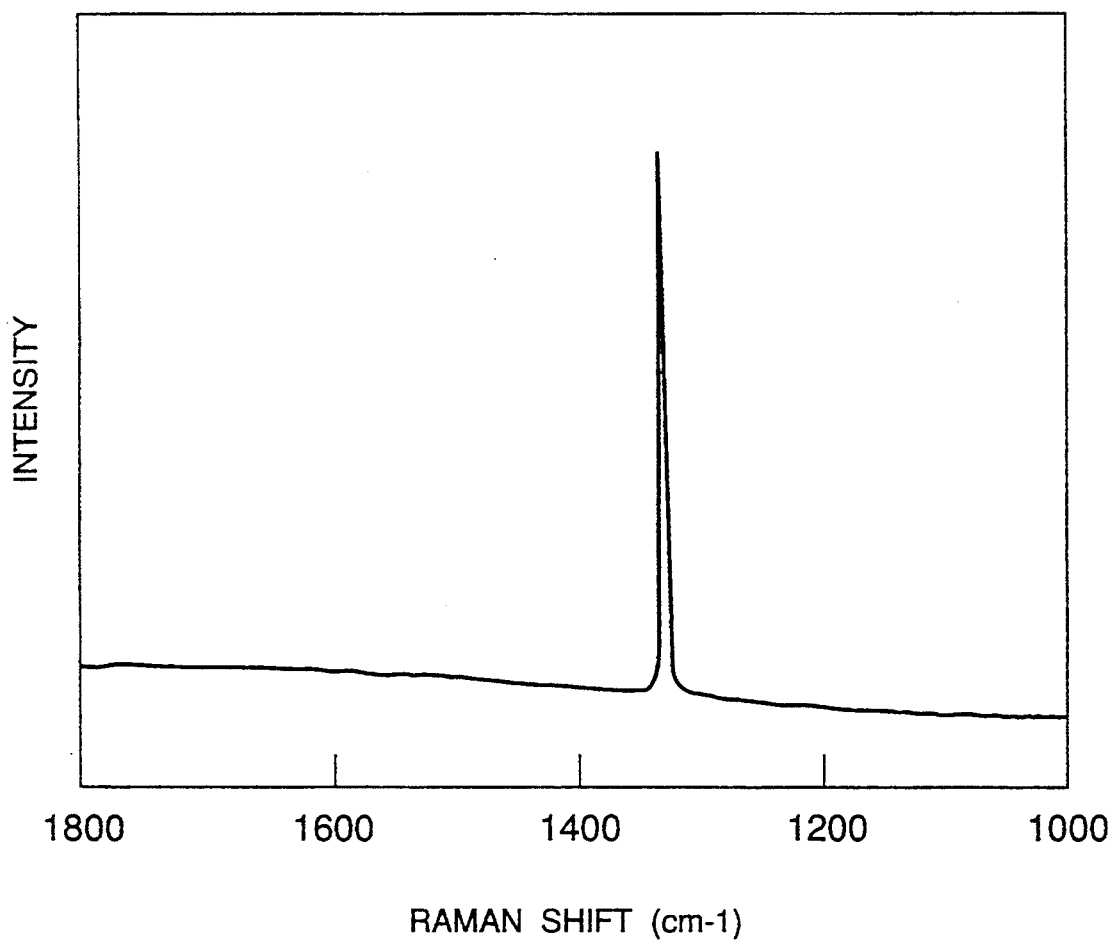
FIG. 5 is a Raman spectrum.
Figure 6:
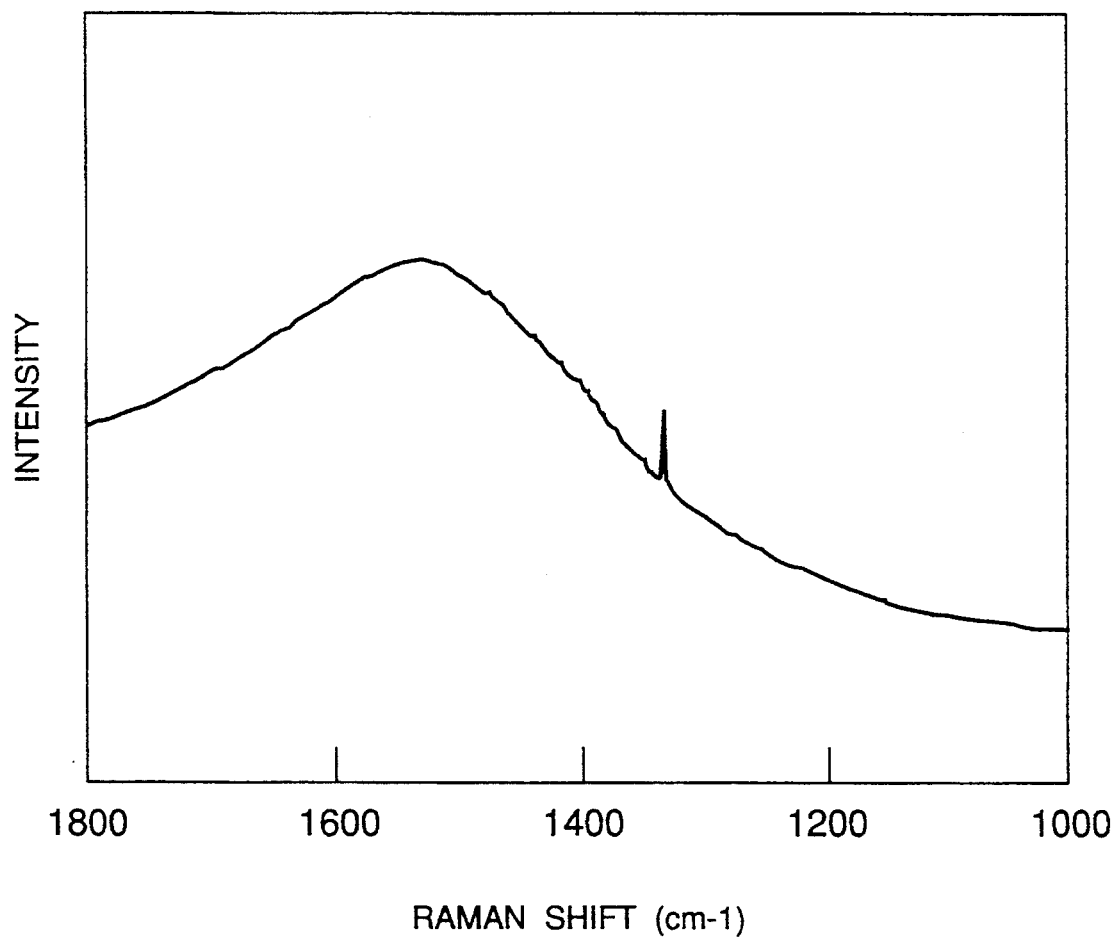
FIG. 6 is a Raman spectrum.

Furthermore, the diamond crystal grains obtained in Example 5 and the thin film precipitates were evaluated using Raman spectroscopic analysis. In FIGS. 5 and 6 are given the spectrum for the diamond crystals and that for the thin film precipitates, respectively. It can be read from the peak height of the spectrum and from the peak width at the half height, that the grain sample taken from the center (a portion to which maximum pressure is applied) is obtained as a nearly complete single crystal grains, whereas those in the periphery are obtained as a continuous deposit in a thin-film, having a diamond structure but yet containing mixed therein those having an amorphous carbon structure.

The diamond obtained from a powder containing graphitic carbon microtubules as in Example 3 yielded a similar Raman spectrum as that shown in FIG. 5. This is noteworthy in that products comparable to those obtained by using $C_{60}$ were obtained rapidly, at a process time one third of the time used in the case using $C_{60}$ as the starting material.

The diamond obtained from a powder containing graphitic carbon microtubules having doped with nitrogen in Example 4 yielded a Raman spectrum more similar to that shown in FIG. 6 than that given in FIG. 5, however, a visible to ultraviolet light absorption analysis revealed that the diamond shows a uniform nitrogen dispersion similar to that of Ib-type diamond, and that it is an n-type semiconductor diamond having a resistivity of 100 $\Omega$·cm or lower with a minimum of 76 $\Omega$·cm.

As described in the foregoing, the present invention provides a simple process for synthesizing high quality single crystal diamonds under a lower temperature and lower pressure condition using a far compact apparatus as compared with a conventional high pressure synthesis. That is, the present invention comprises applying a gradient pressure (pressure having a distribution) to a starting powder material containing $C_{60}$ and/or graphitic carbon microtubules as the principal component, while irradiating through a window comprising diamond, a laser beam to the powder portion to which maximum pressure is applied.

Furthermore, because a far compact high pressure vessel as compared to the conventional direct conversion process is feasible, the process can be applied to mass production by exchanging the high pressure vessels.

The process also provides semiconductor diamonds easily by using graphitic carbon microtubules having synthesized in an impurity atmosphere as the starting powder material.

While the invention has been described in detail and with reference to specific embodiments thereof, it will be apparent to one skilled in the art that various changes and modifications can be made therein without departing from the spirit and scope thereof.

What is claimed is:

1. A method for forming diamond comprising the steps of:
   placing a starting material comprising carbon in a vessel capable of pressing said starting material where a pressure within said material has a distribution;
   pressing said starting material within said vessel; and
   irradiating at least a portion of said starting material with a laser beam during pressing, wherein the pressure having said distribution takes a maximum value at said portion.

2. The method of claim 1 wherein said starting material comprises a fullerene.

3. The method of claim 1 wherein the pressure is 2 to 50 GPa.

4. The method of claim 1 wherein said laser beam is irradiated to said portion through a diamond window provided on said vessel.

5. The method of claim 4 wherein said diamond window comprises a diamond plate comprising 2a type single crystal.

6. The method of claim 4 wherein said diamond window comprises a diamond functioning as a nucleus of epitaxial growth of said diamond to be formed.

7. The method of claim 1 wherein said laser beam comprises an infrared light or a visible light.

8. The method of claim 1 wherein said starting material comprises a material selected from the group consisting of $C_{60}$, a carbon microtubule and a combination thereof.

9. The method of claim 1 wherein said starting material contains an impurity selected from the group consisting of nitrogen, boron and phosphorus.

10. The method of claim 9 wherein a diamond semiconductor is formed by said method.

11. The method of claim 1 wherein said laser beam has a wavelength capable of crystallizing said starting material.

12. A method for forming diamond comprising the steps of:

placing a starting material comprising carbon within a vessel capable of pressing said starting material and having a window made of a single crystalline diamond;

pressing said starting material within said vessel; and irradiating at least a portion of said starting material with a laser beam during pressing through said window.

13. The method of claim 12 wherein said starting material comprises a fullerene.

14. The method of claim 12 wherein said pressing step is carried out at a pressure of 2 to 50 GPa.

15. The method of claim 12 wherein said starting material comprises a material selected from the group consisting of $C_{60}$, a carbon microtubule and a combination thereof.

16. The method of claim 12 wherein said starting material contains an impurity selected from the group consisting of nitrogen, boron and phosphorus.

* * * * *